(12) United States Patent
Cheng et al.

(10) Patent No.: US 7,101,090 B2
(45) Date of Patent: Sep. 5, 2006

(54) TRANSCEIVER ASSEMBLY FOR USE IN FIBER OPTICS COMMUNICATIONS

(75) Inventors: Hengju Cheng, Mountain View, CA (US); Lee L. Xu, Cupertino, CA (US); Brian Kim, Fremont, CA (US); Darren Crews, Cupertino, CA (US); Jesse Chin, Hillsborough, CA (US)

(73) Assignee: Stratos International, Inc., Chicago, IL (US)

( * ) Notice: Subject to any disclaimer, the term of this patent is extended or adjusted under 35 U.S.C. 154(b) by 0 days.

(21) Appl. No.: 11/366,896

(22) Filed: Mar. 2, 2006

(65) Prior Publication Data

US 2006/0147159 A1 Jul. 6, 2006

Related U.S. Application Data

(62) Division of application No. 09/954,133, filed on Sep. 17, 2001, now Pat. No. 7,056,032.

(51) Int. Cl.
*G02B 6/36* (2006.01)

(52) U.S. Cl. .............................. 385/88; 385/49; 385/90

(58) Field of Classification Search ................. 385/88, 385/89, 92, 49, 90
See application file for complete search history.

(56) References Cited

U.S. PATENT DOCUMENTS

| | | |
|---|---|---|
| 5,011,246 A | 4/1991 | Corradetti et al. |
| 5,117,476 A | 5/1992 | Yingst et al. |
| 5,202,943 A | 4/1993 | Carden et al. |
| 5,445,608 A | 8/1995 | Chen et al. |
| 5,499,311 A | 3/1996 | DeCusatis |
| 5,536,466 A | 7/1996 | Ogawa et al. |
| 5,548,677 A | 8/1996 | Kakii et al. |
| 5,561,727 A | 10/1996 | Akita et al. |
| 5,574,814 A | 11/1996 | Noddings et al. |
| 5,590,232 A | 12/1996 | Wentworth et al. |
| 5,611,013 A | 3/1997 | Curzio |
| 5,655,290 A | 8/1997 | Moresco et al. |
| 5,768,456 A | 6/1998 | Knapp et al. |
| 5,784,513 A | 7/1998 | Kuribayashi et al. |
| 5,852,257 A | 12/1998 | Dittman et al. |
| 5,913,002 A | 6/1999 | Jiang |
| 5,917,976 A | 6/1999 | Yamaguchi |
| 5,947,753 A | 9/1999 | Chapman et al. |
| 5,982,633 A | 11/1999 | Jeansonne |
| 6,056,448 A | 5/2000 | Sauter et al. |
| 6,075,634 A | 6/2000 | Casper et al. |
| 6,085,007 A | 7/2000 | Jiang et al. |
| 6,104,088 A | 8/2000 | Hatano et al. |
| 6,112,002 A | 8/2000 | Tabuchi |
| 6,130,979 A | 10/2000 | Isaksson et al. |

(Continued)

*Primary Examiner*—Fayez G. Assaf
(74) *Attorney, Agent, or Firm*—Karl D. Kovach

(57) ABSTRACT

An optoelectronic subassembly includes a planar substrate, a set of guide pins, and a support block. The planar substrate has an array of photoactive components mounted on the planar substrate and a set of apertures in the planar substrate are aligned with the photoactive components. The set of guide pins have proximal and distal ends extending through the set of apertures in the planar substrate. The support block includes a set of support passages in which the distal ends of the guide pins are cemented, and a support face which is at right angles to the set of support passages. The optoelectronic subassembly is for use in a fiber optic communications transceiver which is adapted for being mechanically and optically connected to an optical ferrule. The optical ferrule supports an array of optical communications fibers.

1 Claim, 7 Drawing Sheets

U.S. PATENT DOCUMENTS

| | | | |
|---|---|---|---|
| 6,137,929 | A | 10/2000 | Rosenberg et al. |
| 6,164,838 | A | 12/2000 | Maehara et al. |
| 6,203,212 | B1 * | 3/2001 | Rosenberg et al. ............ 385/92 |
| 6,217,231 | B1 | 4/2001 | Mesaki et al. |
| 6,234,687 | B1 * | 5/2001 | Hall et al. .................... 385/88 |
| 6,250,820 | B1 | 6/2001 | Melchoir et al. |
| 6,263,137 | B1 | 7/2001 | Yoneyama et al. |
| 6,305,987 | B1 | 10/2001 | Crane et al. |
| 6,318,909 | B1 | 11/2001 | Giboney et al. |
| 6,322,257 | B1 | 11/2001 | Kryzak |
| 6,406,196 | B1 | 6/2002 | Uno et al. |
| 6,417,463 | B1 | 7/2002 | Cornelius et al. |
| 6,457,877 | B1 | 10/2002 | Kato et al. |
| 6,547,455 | B1 | 4/2003 | Hashizume |
| 6,641,310 | B1 | 11/2003 | Williams |
| 6,646,777 | B1 | 11/2003 | Qin et al. |
| 6,647,039 | B1 | 11/2003 | Fu et al. |
| 6,653,557 | B1 | 11/2003 | Wolf et al. |
| 6,676,302 | B1 | 1/2004 | Cheng et al. |
| 6,767,142 | B1 * | 7/2004 | Stricot et al. ................. 385/92 |
| 6,773,532 | B1 | 8/2004 | Wolf et al. |
| 2002/0019174 | A1 | 2/2002 | Crane et al. |
| 2002/0047088 | A1 | 4/2002 | Ishii et al. |
| 2003/0044157 | A1 | 3/2003 | Wickman et al. |
| 2003/0161592 | A1 | 8/2003 | Wolf et al. |
| 2003/0161593 | A1 | 8/2003 | Stackhouse |
| 2005/0013560 | A1 | 1/2005 | Mazotti et al. |
| 2005/0276547 | A1 | 12/2005 | Wang et al. |
| 2005/0286838 | A1 | 12/2005 | Oki et al. |

\* cited by examiner

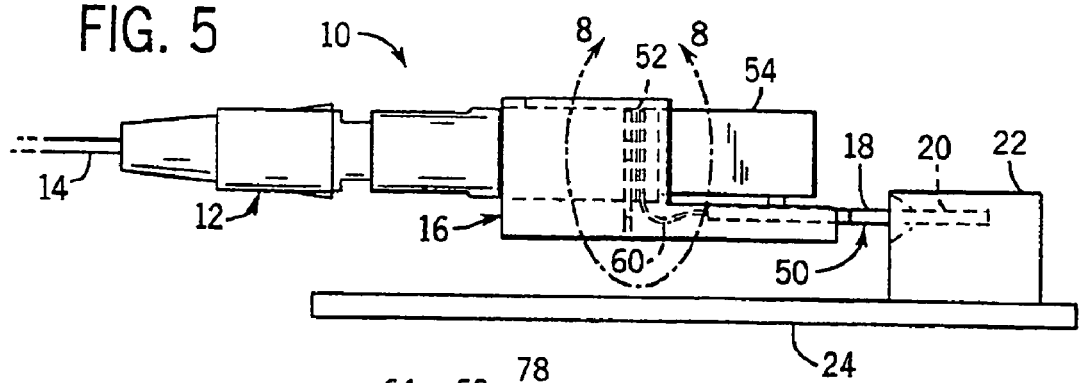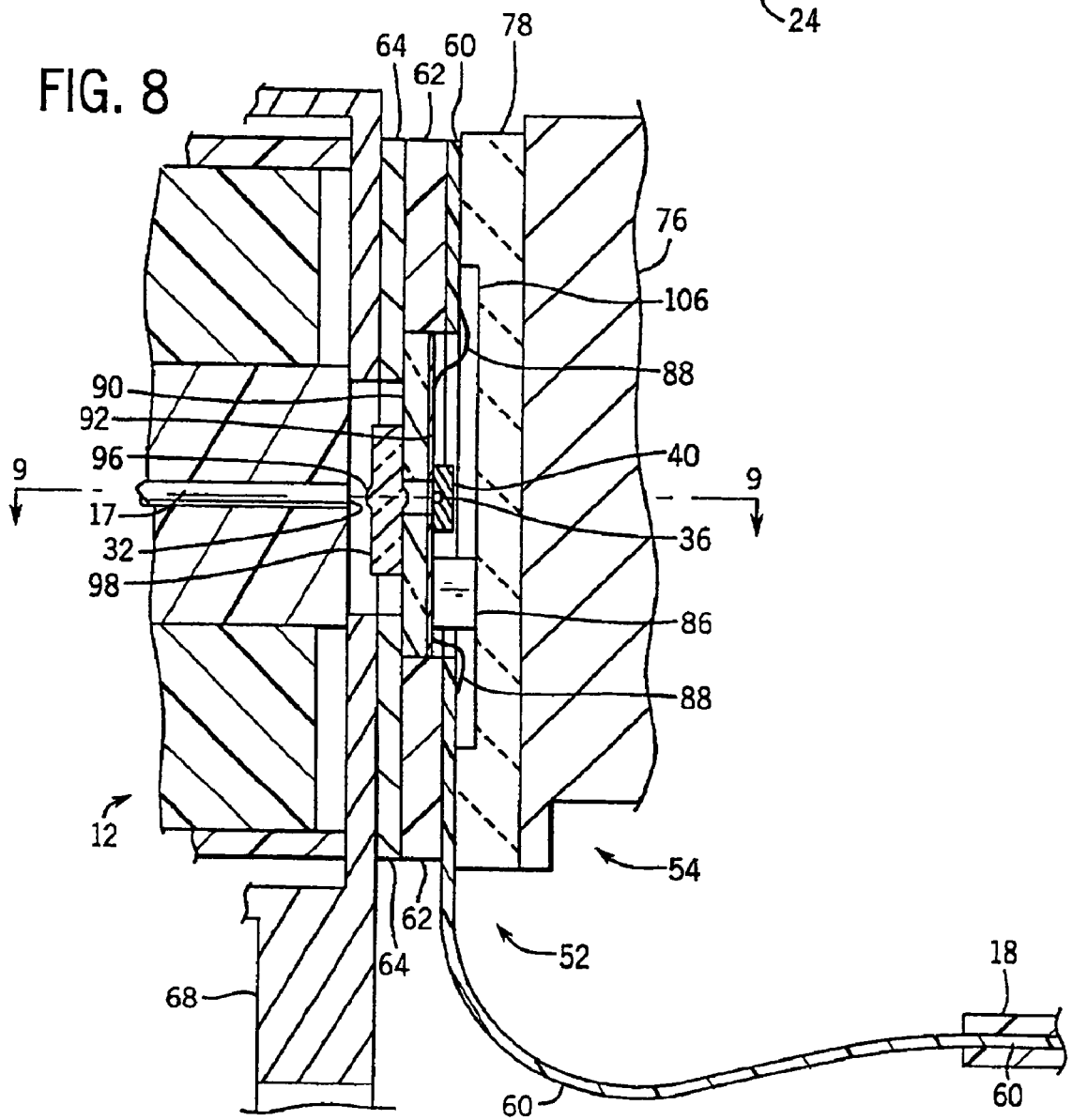

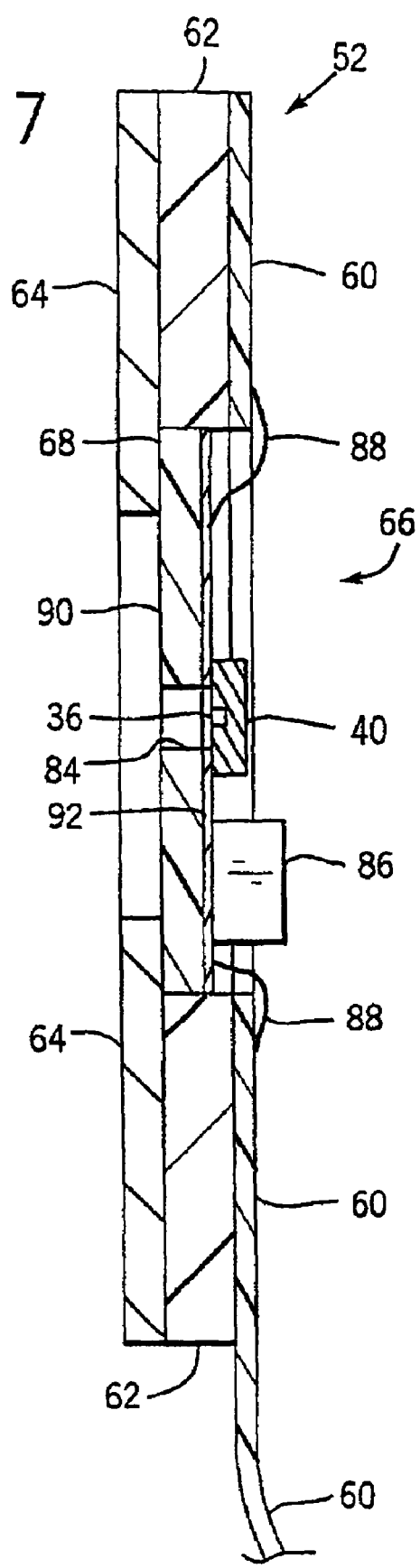

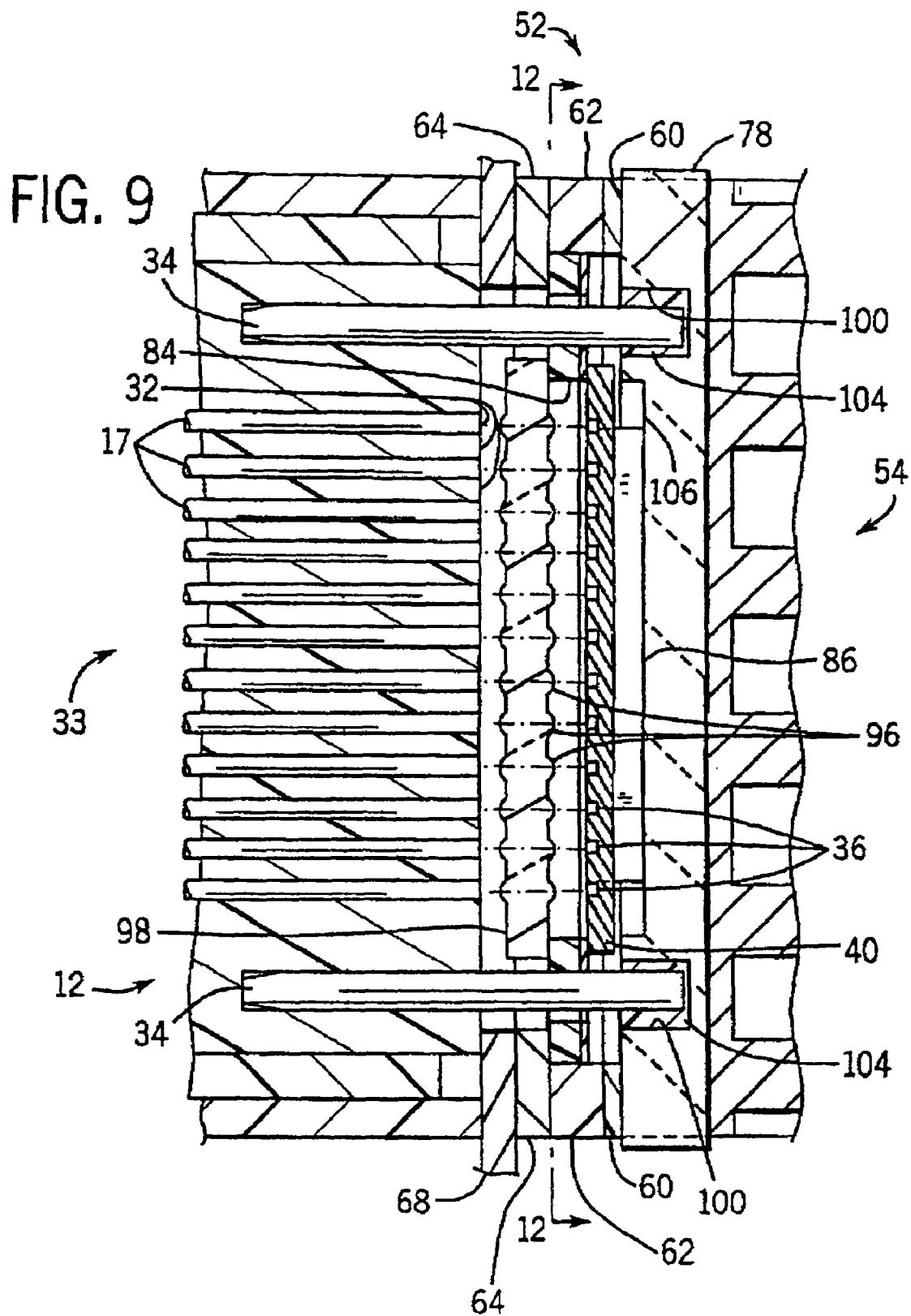

TRANSCEIVER ASSEMBLY FOR USE IN FIBER OPTICS COMMUNICATIONS

This is a divisional of application Ser. No. 09/954,133 filed Sep. 17, 2001, now U.S. Pat. No. 7,056,032 which is hereby incorporated herein by reference.

BACKGROUND OF THE INVENTION

1. Field of the Invention

The present invention relates generally to optoelectronic devices, and more specifically to parallel optics assemblies for use in fiber optic communications.

2. Discussion of the Background

The majority of computer and communication networks today rely on copper wiring to transmit data between nodes in the network. However, copper wiring has relatively limited bandwidth for carrying electrical signals which greatly constrains the amounts of data that it can be used to transmit.

Many computer and communication networks, including a large part of the Internet, are now being built using fiber optic cabling which has superior bandwidth capabilities and can be used to transmit much greater amounts of data. With fiber optic cabling, data is transmitted using light signals (also called optical or photonic signals), rather than electrical signals. For example, a logical one may be represented by a light pulse of a specific duration and a logical zero may be represented by the absence of a light pulse for the same duration. In addition, it is also possible to transmit at the same time light at different wavelengths over a single strand of optic fiber, with each wavelength of light representing a distinct data stream. However, since computers use electrical signals as opposed to light signals the light signals used to transmit data over fiber optic links must be translated to electrical signals and vice-versa during the optical communication process. Building such fiber optic networks therefore requires optoelectronic transceivers which interface optical transmission mediums to electronic computing devices and transform optical signals to electronic signals and electronic signals to photonic signals. Such optoelectronic transceivers (transmitters or receivers) may be provided using semiconductor devices (photoactive devices) such as photodiodes which act as photo-receivers or LEDs or laser diodes which act as photo-transmitters. While transceivers using such devices can provide satisfactory performance, the optical alignment of the photoactive devices with the ends of the thread-like fiber optic ends must be precise for an effective transfer of optical power. In parallel optics modules which use multiple fibers and multiple communications channels for high bandwidth applications the fiber optic ends are closely spaced in an array which greatly increases the complexity of this alignment task.

One past alignment technique for use in constructing parallel optics modules was to etch alignment grooves along the surface of a silicon substrate using photolithography techniques. These grooves were then used in precisely positioning the fibers and fiber optic ends in aligned relationships to edge-emitting laser diodes. Although this technique can accurately align the optical components, the arrays must be manually assembled. Consequently, the process is labor intensive and results in low yields due to assembly errors and quality assurance problems.

More recently some parallel optics modules have come to use metal lead frames for mounting the photoactive devices. The lead frames then have alignment holes that cooperate with guide pins for alignment purposes. The guide pins extend from the holes in the lead frame to corresponding holes in a ferrule supporting the optic fibers in order to provide for the alignment of the ferrule with the lead frame and the fibers with the photoactive devices. However, this type of design has weaknesses. The optoelectronic device must be very accurately mounted onto the metal lead frame and at the same time the alignment holes extending through the lead frame must be very accurately positioned. Should the optoelectronic device or alignment holes be misaligned, optical misalignment will occur even though the optical fibers may appear to be correctly aligned.

SUMMARY OF THE INVENTION

The present invention is directed to a transceiver (alternately either a transmitter or receiver) assembly which comprises an optoelectronic subassembly for use within fiber optic communications systems where multiple optical fibers are used in transmitting and receiving photonic signals. The transceiver assembly is adapted for being mechanically and optically connected with an optical ferrule supporting a set of optical communications fibers. The transceiver assembly supports an optoelectronic device having a set of photoactive components corresponding to the fibers. The optoelectronic device is operative for either converting photonic signals to electrical signals (in a receiver) or converting electrical signals to photonic signals (in a transmitter). The transceiver assembly includes a frame section having a carrier which is precisely fabricated for aligning and supporting the optoelectronic device and photoactive components within it and includes an alignment structure for cooperating with the optical ferrule to align the photoactive components of the optoelectronic device with the fibers in the ferrule when the two are interconnected. The frame section is part of a larger carrier assembly including a multilayer circuit board, a pluggable edge connector for electrically connecting with a communications or computer system and a flex circuit for providing communications lines linking the frame section, multilayer circuit board and edge connector. The flex circuit runs throughout the carrier assembly forming part of the frame section and the circuit board. A microcontroller may be mounted on the multilayer circuit board for use in controlling signals provided to the optoelectronic device.

In the preferred embodiment, the optoelectronic subassembly includes a planar substrate, a set of guide pins, a support block, one or more alignment marks, an optoelectronic device, a window, and a transparent film layer. The planar substrate has an array of photoactive components mounted on the planar substrate and a set of apertures in the planar substrate are aligned with the photoactive components. The set of guide pins have proximal and distal ends extending through the set of apertures in the planar substrate. The support block includes a set of support passages in which the distal ends of the guide pins are cemented, and a support face which is at right angles to the set of support passages on which the planar substrate is mounted. The one or more alignment marks are deposited on the planar substrate using photolithography techniques. The optoelectronic device contains the array of photoactive components positioned and secured on the planar substrate with reference to the one or more alignment marks. The window section is etched in the planar substrate using photolithography techniques. The transparent film layer is deposited on the planar substrate over the window section on which the one or more alignment marks are deposited. The optoelectronic subassembly is for use in a fiber optic communications transceiver which is adapted for being mechanically and optically connected to an optical ferrule. The optical ferrule supports an array of optical communications fibers.

These and other features and advantages of the present invention will be presented in more detail in the following description of the invention and the accompanying figures that illustrate by way of example the principles of the invention.

BRIEF DESCRIPTION OF THE DRAWINGS

The invention and its advantages may best be understood by reference to the following description taken in conjunction with the accompanying drawings, wherein:

FIG. 5 is a side view of the fiber optic communications assembly shown in FIG. 1 illustrating, among other things, the position of the carrier assembly within the subassembly and how the optoelectronic subassembly may be pluggably connected to a jack mounted on printed circuit board of a data processing system or the like;

FIG. 7 is an enlarged, vertical, cross-sectional view focusing in on the carrier and frame section components of the present invention as shown in FIG. 6;

FIG. 8 is a vertical cross sectional view of the assembly of the present invention taken along lines 8—8 of FIG. 5 showing, among other things, the alignment of the optical fibers of the ferrule and photoactive components of the optoelectronic device;

FIG. 9 is a lateral cross sectional view of the assembly of the present invention taken along lines 9—9 of FIG. 5 showing again, among other things, the alignment of the optical fibers of the ferrule and photoactive components of the optoelectronic device;

DETAILED DESCRIPTION OF THE INVENTION

The present invention will now be described in detail with reference to preferred embodiments as illustrated in the accompanying drawings. In the following description, numerous specific details are set forth in order to provide a thorough understanding of the present invention. However, it should be apparent to one skilled in the art that the present invention may be practiced without some or all of these specific details. In other instances it should be appreciated that well-known process steps have not been described in detail in order to not obscure the present invention.

Figure 1:
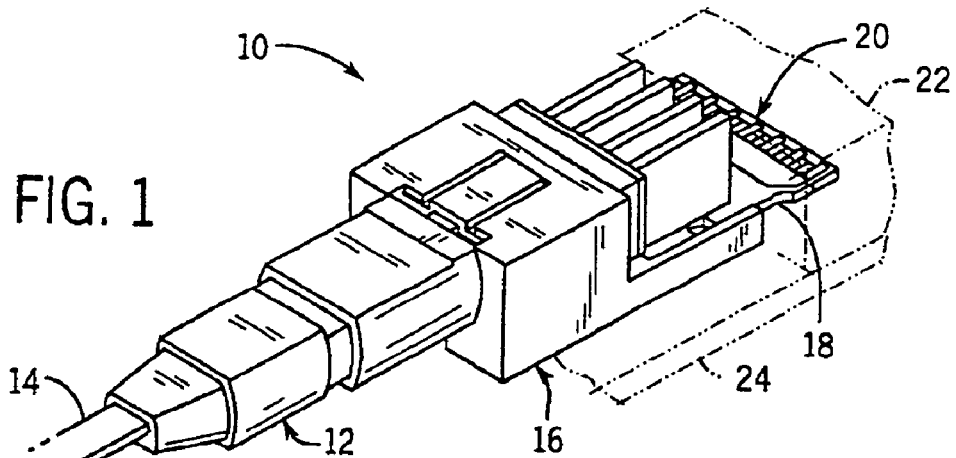
FIG. 1 is an overhead, front, perspective view of a fiber optic communications assembly constructed in accordance with the principles of the present invention showing a ferrule supporting optical communications fibers interconnected with an optoelectronic subassembly for use in converting optical signals to electrical signals and vice-versa.
Figure 2:
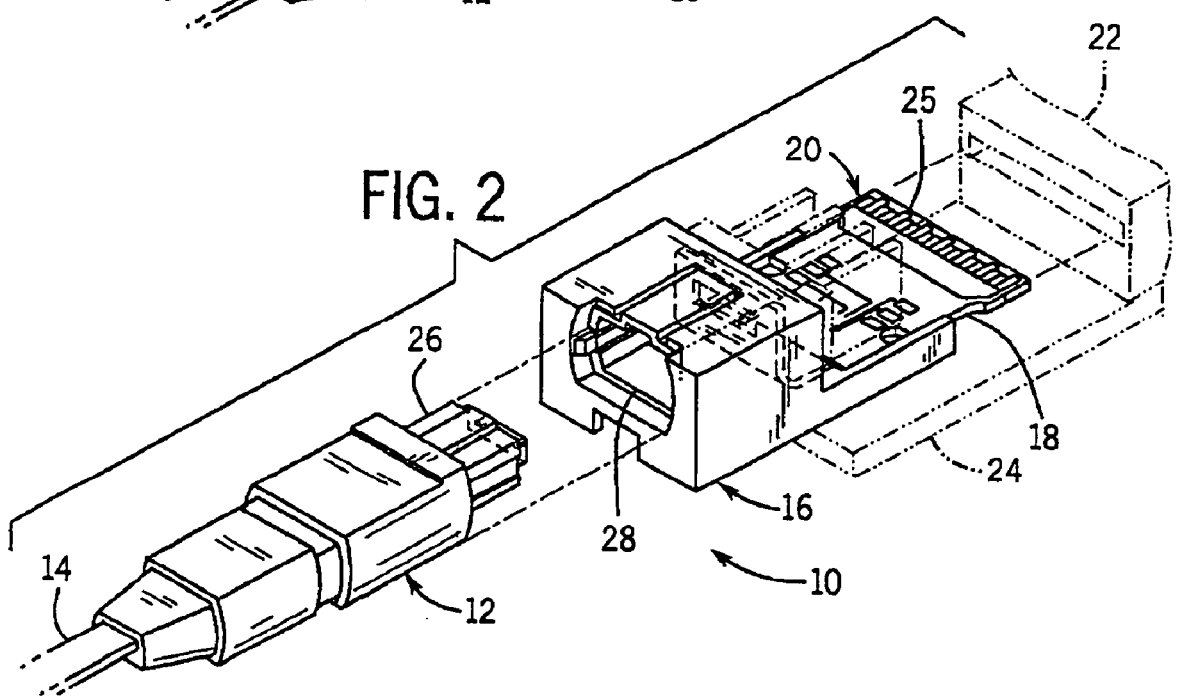
FIG. 2 is an expanded, overhead, front, perspective view of the fiber optics communications assembly shown in FIG. 1 with the ferrule disconnected from the subassembly and the subassembly unplugged from the jack to or from which it supplies electrical signals.

Referring now to FIGS. 1 and 2, a fiber optic connector assembly 10 is shown as comprising an optical ferrule 12 of the type sometimes referred to in the industry as an MT ferrule installed on the end of a cable 14 carrying multiple fiber optic communication elements 17 (not shown in FIGS. 1–2) and an optoelectronic subassembly 16 which operates as a transceiver module for either transmitting light (photonic) signals or receiving light signals and converting these signals to or from electrical signals. The subassembly 16 includes a small printed circuit board (PCB) 18 having an edge connector 20 with connection pads 25 on both sides which can be readily plugged into and out of an electrical connection jack 22 (in phantom) mounted on a circuit board 24 (in phantom) of a computer or communications system to or from which data can then be relayed over the cable 14 through the subassembly 16. The ferrule 12 and subassembly 16 are adapted for interconnection when the proximal end 26 of the ferrule 12 is inserted and latched within a cavity 28 in the subassembly 16. The ferrule 12 and subassembly 16 are then positioned and aligned so that optical signals can be transmitted either to or from the ferrule 12 and from or to the subassembly 16 for enabling data flow between the cable 16 and printed circuit board 24 (in phantom).

Figure 3:
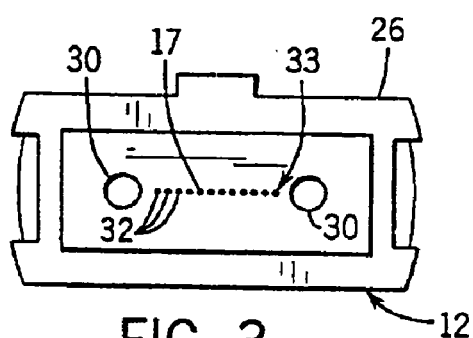
FIG. 3 is a front view of the ferrule shown in FIGS. 1–2, showing, among other things, the optical fiber ends and alignment holes.

Referring now to FIG. 3, the proximal end 26 of the ferrule 12 is shown which includes a pair of alignment holes 30 and a set of twelve optical communications fibers 17 having polished fiber ends 32. The fibers 17 and their polished ends 32 are rigidly supported within the ferrule 12. The fiber ends 32 are disposed in a linear array 33 at regular 250 micron intervals along a line extending between the alignment holes 30. The fiber ends 32 are precisely aligned with the holes 30.

Figure 4:
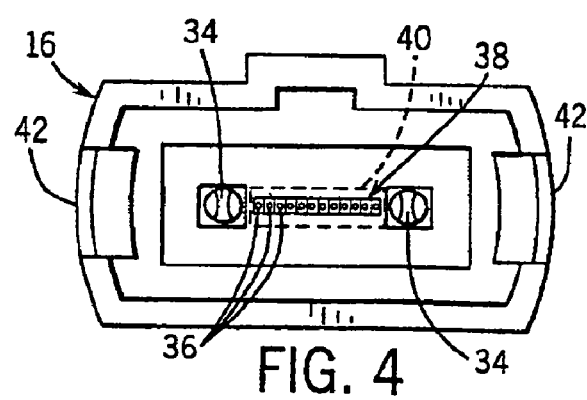
FIG. 4 is a front view of the optoelectronic subassembly shown in FIGS. 1–2 showing, among other things, the photoactive components and the guide pins.

Referring now to FIG. 4, the cavity 28 is defined by a receptacle 25 having jaws 42 for latching onto the ferrule 12. A pair of alignment or guide pins 34 and a set of twelve photoactive components 36 are disposed at the inner end of the cavity 28. The photoactive components 36 are deployed on and as part of an integrated circuit (IC) chip that comprises an optoelectronic device 40 (in phantom). The photoactive components 36 may be either semiconductor transmitter elements or semiconductor receiver elements and are disposed in a linear array 38 at regular 250 micron intervals along a line extending between the alignment pins 34. The optoelectronic device 40 and photoactive components 36 are precisely aligned with the guide pins 34. If the photoactive elements 36 are intended to be transmitter elements (a transmitter subassembly) they may for example be light emitting diodes (LEDs) or laser diodes. They are preferably vertical cavity surface-emitting lasers (VCSELs). If the photoactive elements 36 are intended to be receivers elements (a receiver subassembly) they may for example be PIN photodiodes or avalanche photodiodes (APDs) although they are preferably PIN photodiodes. When the proximal end 26 of the ferrule 12 is latched into the cavity 28 by the jaws 42 the alignment pins 34 in the subassembly 16 are engaged with the alignment holes 30 in the ferrule 12 which in turn precisely aligns the photoactive components 36 in the array 38 with the fiber ends 32 in the array 33 so that photonic signals can pass between them.

Referring now to FIG. 5, the parallel optics assembly 10 is shown with the ferrule 12 latched into the subassembly 16 and with the edge connector 20 (in phantom) plugged into the jack 22 so that the pads 25 are in electrical contact with the elements of a connector lead frame (not shown) within the jack 22. The jack 22 is surface mounted on the circuit board 24 and thereby electrically interconnected with the circuitry on the board 24 and the computer or communication system of which it is a part. The edge connector 20 and jack 22 enable the subassembly 16 to be removably connected to the board 24. The subassembly 16 includes a carrier assembly 50 (mostly in phantom) which has a planar frame section 52 at one end sandwiched in between the ferrule 12 and a heat sink 54. The carrier assembly 50 also includes a flex circuit 60 (in phantom) which is bendable and forms part of the frame section 52 and part of the circuit board 18. The flex circuit 60 extends from the frame section 52 at one end and passes under the heat sink 54 in order to connect up with the circuit board 18 at its opposite end.

Figure 6:
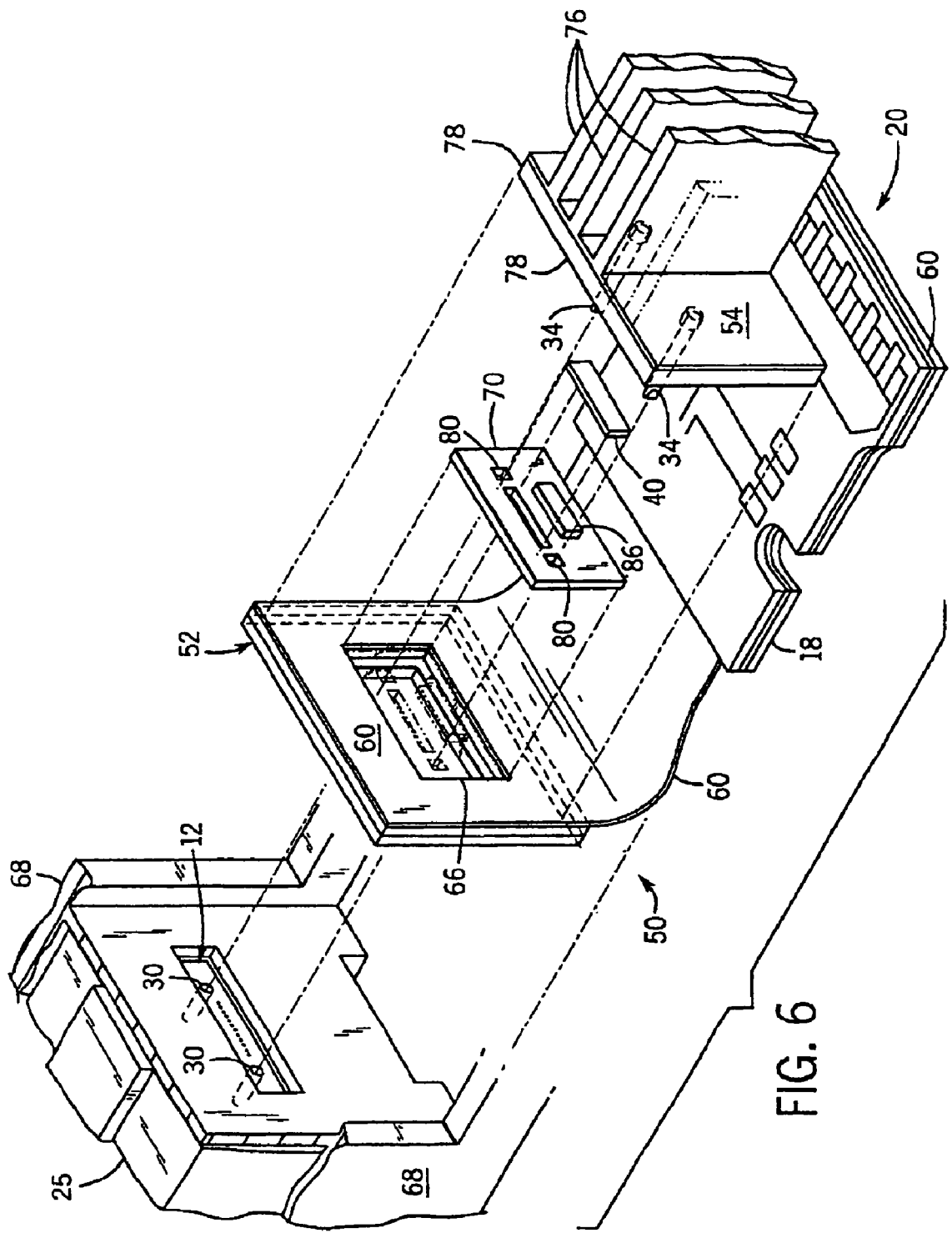
FIG. 6 is an enlarged, expanded, overhead, rear perspective view of the subassembly of the present invention showing, among other things, how the carrier for mounting the optoelectronic device and carrier assembly relate to the other components of the optoelectronic subassembly.

Referring now to FIG. 6, the ferrule 12 is shown as mounted within the receptacle 25 which is in turn supported within a metal support frame 68. The heat sink 54 is shown as including cooling fins 76 and is attached to a ceramic support block 78 which mounts and supports the alignment pins 34. The frame section 52 is sandwiched in between the ferrule 12 and the heat sink 54. The optoelectronic device 40 containing the photoactive components 36 is mounted on a carrier 70 which is installed within a well 66 in the frame section 52. The flex circuit 60 comprises one of the layers in the frame section 52 and one of the layers in the circuit board 18 while also running between the frame section 52 and the circuit board 18 and providing a large number of electrical connection lines between the two. The frame section 52, flex circuit 60 and circuit board 18 comprise the carrier assembly 50. The alignment or guide pins 34 are intended to extend from the support block 78 through a pair of alignment apertures 80 in the carrier 70 into the alignment holes 30 in the ferrule 12.

Referring now to FIG. 7, the frame section 52 includes a flex circuit layer 60, a spacing layer 62 of PCB laminate material and a support layer 64 of metal such as copper. The flex circuit layer 60, the spacing layer 62 and the support layer 64 include window sections which are centrally disposed within the frame section 52 and which define a rectangular well 66. The window section in the support layer 64 is dimensioned to be slightly smaller than the others so as to form a shelf 68 on which the carrier 70 is mounted within the well 66 on a level with the spacing layer 62. The carrier 70 comprises a planar silicon substrate layer 90 having a thickness of about 250 microns along with a very thin silicon dioxide layer 92 having a thickness of about 2 or 3 microns which extends across the rear face of the silicon substrate layer 90. The optoelectronic device 40 is precisely mounted on the rear face of carrier 70 on top of the alignment layer 92 so that the photoactive components 36 are positioned over a narrow slot-like window section 84 in the silicon substrate layer 90. In this configuration the photoactive components 36 direct or receive photonic signals from the back side of the carrier 70 through the window section 84. A second integrated circuit chip 86 is mounted on the rear face of the carrier 70 and provides specific signal processing functions. If the subassembly 16 is a transmitter, the chip 86 is adapted for operating as signal driver for the photoactive components 36. If the subassembly 16 is a receiver, the chip 86 is adapted for operating as a signal amplifier. Wire bonds may be used to connect the signal processing chip 86 to the optoelectronic device 40. However, the optoelectronic device 40 and signal processing chip 86 are preferably connected by conductive traces laid down on the surface of the carrier 70 for carrying signals between the two. Wire bonds 88 are used to connect the signal processing chip 86 to the signal, power and control lines running through the flex circuit 60 although conductive traces and connection pads on the carrier 70 may be used to assist in these connections.

Referring now to FIGS. 8 and 9, the frame section 52 including the carrier 70 and optoelectronic device 40 is mounted in between the ferrule 12 and its support frame 68 on one side and the heat sink 54 and support block 78 on the other. The ends 32 of the optical communications fibers 17 are precisely aligned with the photoactive components 36 in the optoelectronic device 40. The support block 78 includes a recessed section 106 that accommodates raised elements associated with the carrier 70 such as the wire bonds 88 and signal processing chip 86. The top of the signal processing chip 86 is mounted flush with the interior surface of the support block 78 in order to facilitate cooling of the chip 86 and heat transfer to the heat sink 54. A set of twelve lenses 96 form a lens array 98 which is mounted on the front face of the carrier 70 over the window section 84. The lenses 96 are disposed in between the photoactive components 36 and the fiber ends 32 along a lateral line between the alignment pins 34 for directing and focusing light from the photoactive components 36 to the fiber ends 32 (in transmitter modules) and from the fiber ends 32 to the photoactive components 36 (in receiver modules). The lenses 96 are rectilinearly deployed on 250 micron centers so that the lens array 98 comprises a linear array corresponding to the arrays formed by the photoactive components 36 and by the fiber ends 32. The lenses 96 are biconvex and are selected to collect and focus as much light as possible from the photoactive components 36 into the cone of acceptance of the fibers 17 or from the fibers 17 onto the photoactive regions of the components 36. To this end the lenses 96, fiber ends 32 and photoactive components 36 are preferably positioned so that the fiber ends 32 and photoactive components 36 are at the image planes of the lenses 96. The guide pins 34 extend from the support passages 100 in the support block 78 through the alignment apertures 80 in the carrier 70 into the alignment holes in the ferrule 12. The alignment apertures 80 are precisely positioned with respect to the optoelectronic device 40. The support passages 100 are of substantially larger diameter than the alignment pins 34. The distal ends of the alignment pins 34 are cemented into place in the support passages 100 using epoxy adhesive 104. The guide pins 34 can thereby be aligned as may be required to interface with the carrier 70 and ferrule 12 and can then be rigidly supported in position.

Figure 10:
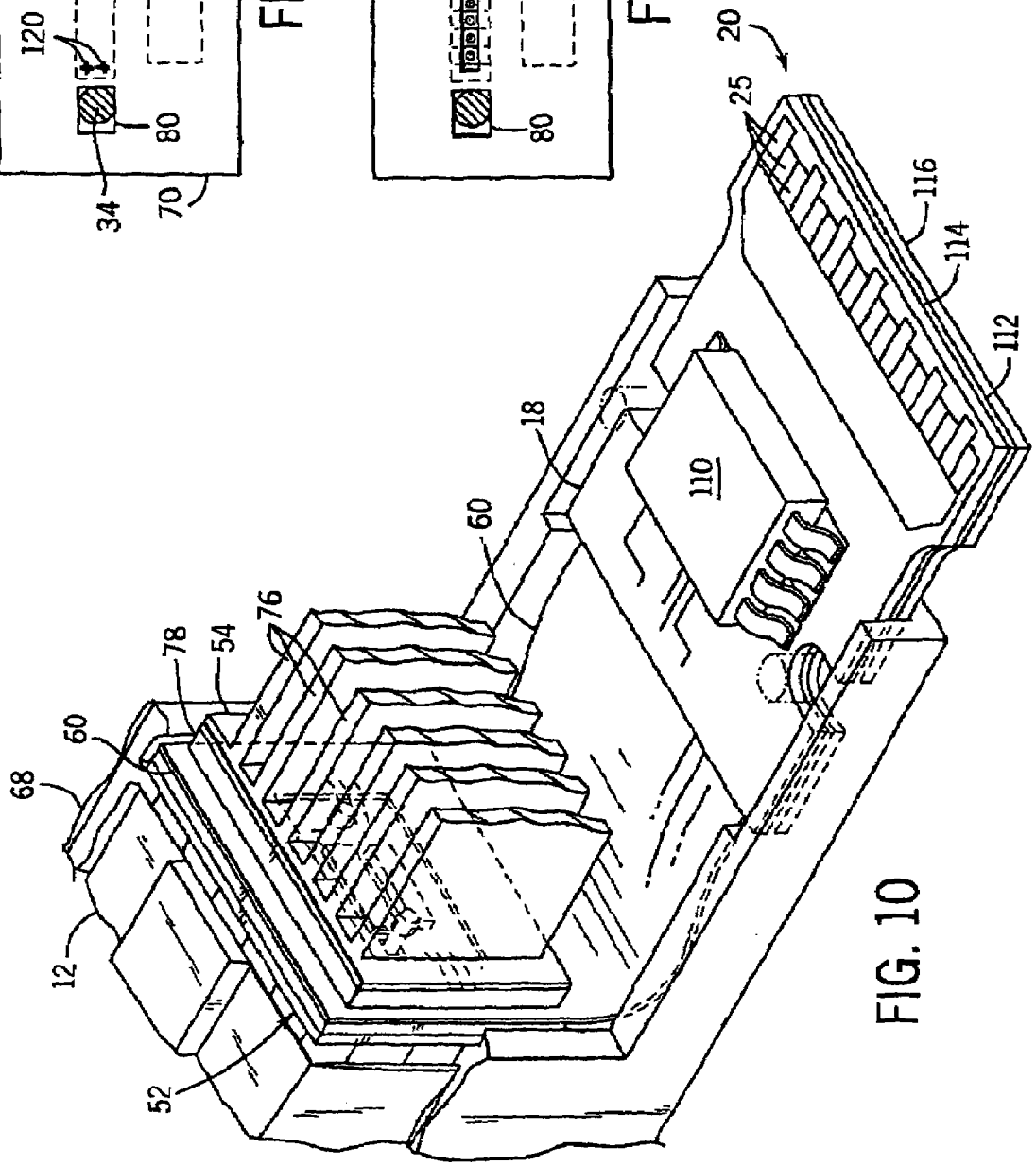
FIG. 10 is an enlarged, expanded, overhead, rear perspective view of the subassembly of the present invention showing the frame section, flex circuit, circuit board and edge connector components of the optoelectronic subassembly.

Referring now to FIG. 10, the frame section 52 is shown in phantom as assembled in position in between the ferrule 12 and the support block 78. The flex circuit 60 contains a large number of conductive traces for transmitting data signals and control signals between the signal processing chip 86 and optoelectronic device 40 in the frame section 52 and the circuit board 18 and edge connector 20. If the subassembly 16 is a transmitter module, a microcontroller chip 110 is bonded to signal pads on the top of the circuit board 18 adjacent to the heat sink 54 and across from the frame section 52. The microcontroller chip 110 generates average power and modulation level control signals for supply to a signal processing chip 86 (optical component driver) in response to temperature signals from the signal processing chip 86. The circuit board 18 includes three layers. The middle layer 112 comprises a section of the flex circuit 60. The top layer 114 and bottom layer 116 comprise rigid FR-4 circuit board layers including conductive circuit traces connecting the connection pads 25 on both sides of the edge connector 20 with the various signal lines in the flex circuit 60.

As shown in FIGS. 3, 4, 6 and, 9 the alignment pins 34 cooperate with the alignment holes in the ferrule 12 and the alignment apertures 80 in the carrier 70 to accurately align the ends 32 of the optical fibers 17 with the photoactive components 36 of the optoelectronic device 40 when the transceiver subassembly 16 is interconnected with the ferrule 12. These alignment apertures 80 are preferably spaced-apart and positioned on opposite sides of the window section 84 for a more precise alignment using at least two reference points. The apertures 80 are sized for close sliding receipt of alignment pins 34. The alignment apertures 80 are fabricated using well-known and highly accurate photolithography techniques such as wet etching of the silicon substrate layer 90 with KOH or dry etching using RIE which may take place from either the front or back side of the carrier 70. These fabrication techniques allow the alignment apertures 80 to achieve precise registration with other features and components on the carrier 70.

Figure 11:
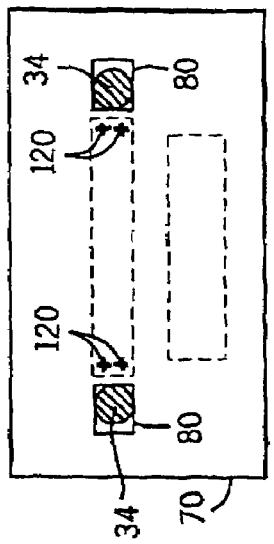
FIG. 11 is a front view of the carrier component of the present invention showing the alignment marks on the carrier and the shape of the alignment apertures.
Figure 12:
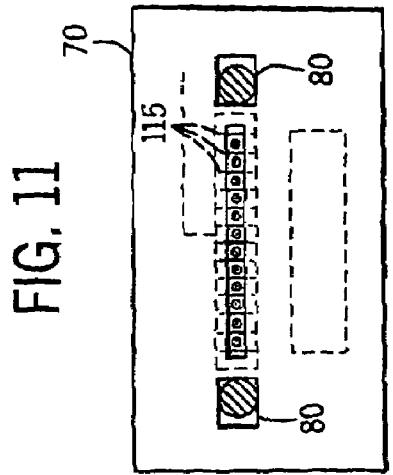
FIG. 12 is a front view of the carrier component of the present invention showing the photoactive components and the grid of metal traces for suppressing EMI emissions.

As shown in FIGS. 11, and 12, the alignment apertures 34 have rectangular cross sections and are slightly elongated to the extent of 3–5 microns in a lateral direction (that is parallel with lines extending between but perpendicular to the guide pins 34) in order to help relieve the potential for the build up of thermal stress by accommodating a small amount of lateral expansion by the pins 34 which may occur due to heat generated as a result of the operation of the IC chips 86 and 40. Thermal forces may otherwise cause deformation or even cracking of the carrier 70 under extreme conditions.

The film layer 92 preferably comprises silicon dioxide although it may alternatively comprise silicon nitride, polysilicon or polyimide and is fabricated onto the silicon substrate layer 90 using well-known photolithography techniques such as vapor deposition or plasma deposition. These deposition techniques enable the thickness and placement of the film layer 92 to be carefully controlled. The film layer 92 is ordinarily formed on the silicon substrate layer 90 before the window portion 84 is etched out of the silicon from the opposite side of the substrate. The thickness of the film layer 92 is preferably in the range of about 2 to 10 microns depending on the material used. The film layer 92 is made to be thin enough to be effectively transparent to light of the wavelengths used for the photonic signals and permit the efficient transmission of the light from the fibers 17 through this layer to the optoelectronic device 40 and from the optoelectronic device 40 through this layer to the fibers 17. The film layer 92 is also fabricated to have sufficient structural integrity to span across the window portion 84, to allow the placement of the alignment marks thereon (as will be later described), and to be sufficiently stable to maintain the position of the alignment marks relative to the alignment apertures 80 during the assembly process.

Referring now to FIG. 12, the film layer 92 extends over the window section 84 and includes one or more optical alignment marks 120 deposited on top of the film layer 92 as minute metal traces using standard photolithography techniques such as e-beam deposition. The alignment marks 120 are precisely aligned relative to the alignment apertures 80 such that when the optoelectronic device 40 is positioned with reference to the alignment marks 120 when it is mounted onto the carrier 70, the optoelectronic device 40 and its photoactive components 36 will be positioned for precise alignment with the ends 32 of the optical fibers 17 upon interconnection between the subassembly 16 and the ferrule 12. The use of the transparent film layer 92 and alignment marks 120 enables a more efficient and accurate deployment of the optoelectronic device 40 on the carrier 70. The alignment marks 120 may be in the form of an array of circles which are sized and spaced to correspond with the alignment of the photoactive components 36 in the optoelectronic device 40 or the marks 120 may be in the form of crosses (as shown) or other fiducial marks. Alternatively, the marks 120 may comprise other photolithographic features or structures such as ridges, bumps or electrical contacts (for use in flip-chip bonding) strategically placed along the surface of the carrier 70 to align with corresponding features or structures of the optoelectronic device 40 and position the optoelectronic device 40 by mechanical as well as visual techniques. While it is preferable to provide at least two spaced-apart alignment marks 120 as reference points to increase alignment accuracy in the plane of the film layer 92 only one alignment mark may be applied if the mark is shaped to align as well as orient the optoelectronic device 40. The alignment marks 120 are preferably placed on the film layer 92 in the region of the window section 84 underneath the location for the optoelectronic device 40. In this configuration, alignment with corresponding features or marks on the optoelectronic device 40 may be performed by using infrared illumination to locate the marks by visual inspection from the reverse side of the carrier 70 looking through the material of the carrier 70 itself. Alternatively, the alignment marks 120 may be placed outside the region of the window section 84 alongside the location for the optoelectronic device 40. This permits direct visual alignment of features on the body of the optoelectronic device 40 with the marks 120 when mounting the optoelectronic device 40 onto the carrier 70. It should be noted that visual alignment is usually performed with the help of optical scopes or machine vision equipment.

As a further alternative it should be noted that if the window section 84 in the substrate 90 is sufficiently narrow then it is possible to dispense with the film layer 92 and have the alignment marks 120 applied directly to the silicon substrate layer 90 alongside or even under the location for the optoelectronic device 40. Alignment can then be similarly accomplished by visual inspection of marks 120 on the substrate 90 with reference to marks or features on the body of the optoelectronic device 40.

The lens array 98 is preferably positioned in the same manner as the optoelectronic device 40 using the alignment marks deposited on the carrier 70. However, since the lens array 98 is mounted on the front side of the carrier 70 the alignment marks for positioning the lens array 98 may be applied to the front side of the carrier 70. Otherwise, alignment marks for the lens array 98 which are applied to the rear face of the carrier 70 may have to be illuminated with infrared light from the front side of the carrier 70. After alignment with reference to lens alignment marks the lens array 98 is bonded in place on the carrier 70 using epoxy resin. As an alternative the lenses array 98 may be laterally extended and include alignment holes also adapted for mating with guide pins 34 for positioning the lens array 98 and lens 96 with respect to the carrier 70 and optoelectronic device 40. The lenses 96 within the lens array 98 may thereby be precisely positioned in the light pathways between the fibers 17 and the photoactive components 36.

The optoelectronic device 40 is mounted on the carrier 70 by flip-chip die attachment bonding and is preferably mounted by flip-chip soldering. Accordingly, a set of electrical contacts are fabricated on the surface of the carrier 70 precisely located for mounting the device 40 in proper alignment with the alignment apertures 80. A set of corresponding contacts on the optoelectronic device 40 are positioned and oriented to coordinate with the electrical contacts on the optoelectronic device 40. When the optoelectronic device 40 is aligned with respect to the alignment marks 120, the corresponding sets of contacts are also aligned. Flip-chip soldering techniques are then applied to mount the optoelectronic device 40 in location on the carrier 70 and thereby also connect the corresponding electrical contacts. Final bonding is performed by infrared reflow of the solder. Surface tension effects assist in aligning the contacts as soldering takes place and thereby flip-chip bonding helps to insure precise alignment of the optoelectronic device 40 on the carrier 70 with respect to the alignment apertures 80.

Referring now to FIGS. 13A, 13B, 13C, 13D, and 13E, the lateral alignment and orientation of the guide pins 34 with respect to the carrier 70 is preferably provided during the assembly process for the transceiver subassembly 16 through the use of an alignment ferrule 124 in combination with the support block 78. It should be noted that throughout FIGS. 13A–13E the carrier 70 is depicted in isolation from its surrounding structures such as the IC chips 86 and 40 mounted on it and the frame section 52 of which it is a part in order to focus on the interaction between the support ferrule 124, carrier 70, alignment apertures 80, support block 78 and support passages 100.

Figure 13A:
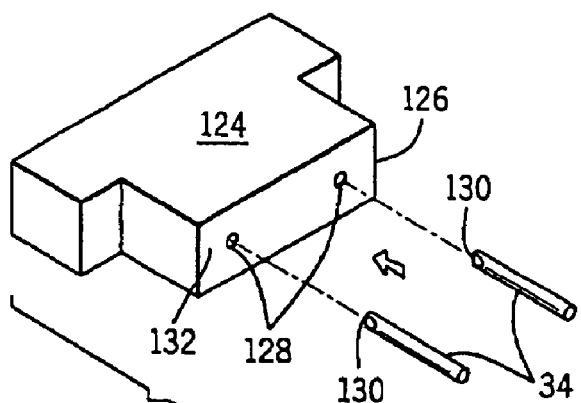
FIGS. 13A, 13B, 13C, 13D, and 13E are diagrammatic prospective and cross-sectional views showing various steps in a preferred method of assembly for the optoelectronic subassembly of the present invention.

As illustrated in FIG. 13A, an alignment ferrule 124 includes and is characterized by a pair of carefully and accurately constructed alignment passages 128. The proximal ends 130 of the guide pins 34 are inserted into the alignment passages 128 in the alignment ferrule 124 during a first step in the assembly process. The alignment passages 128 are operative for precisely spacing-apart, orienting and aligning the guide pins 34 in all three dimensions and at right angles to the alignment face 132.

Figure 13B:
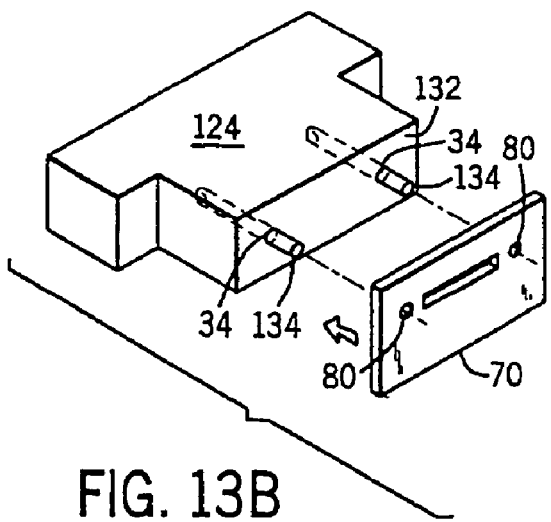

As illustrated in FIG. 13B, the carrier 70 is then placed on the alignment face 132 by inserting the distal ends 134 of the guide pins 34 into the alignment apertures 80 and sliding the carrier 70 toward the alignment ferrule 124 until the carrier 70 is flush against the alignment face 132 and oriented and aligned at right angles with respect to the guide pins 34.

Figure 13C:
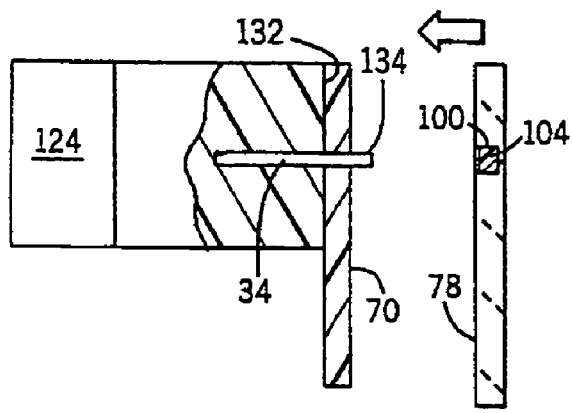

As illustrated in FIG. 13C, the support block 78 is then similarly placed on top of the carrier 70 by inserting the distal ends 134 of the guide pins 34 in the support passages 100 and pushing the support block 78 onto the alignment ferrule until it is flush against the carrier 70 and alignment face 132. As more clearly shown in FIG. 13E the support passages 100 are oversized with respect to the guide pins 34 preferably providing at least 10 microns of dimensional tolerance around the pins and are partially filled with epoxy resin 104 intended to fill the extra space as well as cement the pins in place. The epoxy resin 104 flows around and surrounds the guide pins 34 when they are inserted into the support passages 100.

Figure 13D:
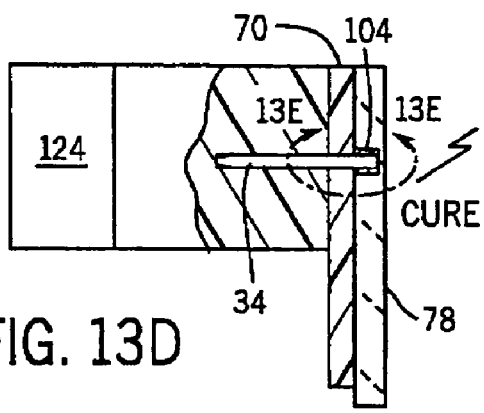
Figure 13E:
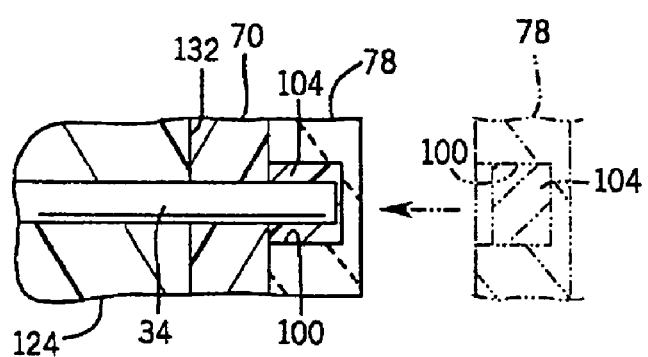

As illustrated in FIG. 13D, after the support block 78 is positioned on the alignment ferrule 124 with the distal ends of the guide pins 34 inserted into the support passages 100 in contact with the epoxy resin 104, the resin is cured to lock the guide pins 34 into alignment and orientation with the carrier 70 by cementing the guide pins 34, carrier 70 and support block 78 together as they are held in proper alignment. The support block 78 thereafter provides support to the guide pins 34 to prevent misalignment, pivoting or rotation and helps protect the carrier 70 from damage which might otherwise occur due the frangible nature of silicon materials.

It should be noted that in order to help reduce the possibility of thermal stress acting through the guide pins 34 the material for the support block 78 should be selected to have a thermal coefficient of expansion similar to that of the materials in the carrier 70. The carrier 70 and support block 78 should therefore have similar thermal expansion properties and should expand or contract under the influence of thermal variations in a substantially similar manner.

Accordingly, the guide pins 34 should not cause thermally induced stress upon or in the carrier 70 which might deform or even crack the frangible material of the carrier 70 even though they are rigidly affixed in the support block 78. Referring now to FIG. 12, in another aspect of the present invention, a set of electrically conductive metal traces 115 are deposited on the film layer 92 across the window portion 84 of the carrier 70 in between the optical pathways between the components 36 and fibers 17 to suppress electromagnetic radiation (EMI) which might otherwise pass through the window section 84. Such interference may be generated pursuant to the high frequency operation of the IC chips 86 and 40 positioned on the rear face of the carrier 70 and can pose a problem for surrounding electronic equipment. The metal traces 115 form a grid of parallel conductive elements which help to block these emissions and conduct this energy to ground through ground connections (not shown). The metallic traces 115 are preferably deposited on the carrier 70 using conventional photolithographic techniques similar to those used in fabricating the alignment marks 120 (e-beam deposition).

Although only a few embodiments of the present inventions have been described in detail, it should be understood that the present invention may be embodied in other forms without departing from the overall spirit or scope of the invention.

What is claimed is:

1. An optoelectronic subassembly for use in a fiber optic communications transceiver which is adapted for being mechanically and optically connected to an optical ferrule supporting an array of optical communication fibers, said optoelectronic subassembly comprising:
    a) a planar substrate including an array of photoactive components mounted on said planar substrate and a set of apertures in said planar substrate which are aligned with said array of photoactive components, and wherein said planar substrate comprises a silicon substrate and said set of apertures are fabricated using photolithography techniques;
    b) a set of guide pins having proximal and distal ends extending through said set of apertures in said planar substrate;

c) a support block having a set of support passages in which the distal ends of said set of guide pins are cemented and having a support face at right angles to said set of support passages on which said planar substrate is mounted;
d) one or more alignment marks deposited on said planar substrate using photolithography techniques;
e) an optoelectronic device containing said array of photoactive components positioned and secured on said planar substrate with reference to said one or more alignment marks;
f) a window section etched in said planar substrate using photolithography techniques; and
g) a transparent film layer deposited on said planar substrate over said window section on which said one or more alignment marks are deposited.

* * * * *